United States Patent
Bartlett

[11] Patent Number: 5,914,617
[45] Date of Patent: Jun. 22, 1999

[54] OUTPUT DRIVER FOR SUB-MICRON CMOS

[75] Inventor: Donald M. Bartlett, Fort Collins, Colo.

[73] Assignee: LSI Logic Corporation, Milpitas, Calif.

[21] Appl. No.: 08/772,617

[22] Filed: Dec. 23, 1996

[51] Int. Cl.$^6$ ........................................... H03K 19/0185
[52] U.S. Cl. ........................... 326/81; 326/83; 326/68
[58] Field of Search .................. 326/70, 71, 68, 326/80, 81, 83, 86

[56] References Cited

U.S. PATENT DOCUMENTS

| | | | |
|---|---|---|---|
| 4,847,522 | 7/1989 | Fuller et al. ............................. | 326/81 |
| 5,173,624 | 12/1992 | Gabillard et al. . | |
| 5,179,299 | 1/1993 | Tipon . | |
| 5,300,832 | 4/1994 | Rogers ...................................... | 326/68 |
| 5,313,118 | 5/1994 | Lundberg . | |
| 5,378,943 | 1/1995 | Dennard ................................... | 326/81 |
| 5,381,055 | 1/1995 | Lai et al. .................................. | 326/27 |
| 5,381,059 | 1/1995 | Douglas ................................... | 326/58 |
| 5,399,920 | 3/1995 | Tran ......................................... | 326/83 |
| 5,406,139 | 4/1995 | Sharpe-Geisler ........................ | 326/71 |
| 5,428,303 | 6/1995 | Pasqualini ................................ | 326/27 |
| 5,440,249 | 8/1995 | Schucker et al. ........................ | 326/83 |
| 5,444,397 | 8/1995 | Wong et al. .............................. | 326/81 |
| 5,467,313 | 11/1995 | Jung et al. ......................... | 365/189.11 |
| 5,483,454 | 1/1996 | Hawkins et al. ......................... | 326/81 |
| 5,559,464 | 9/1996 | Orii et al. ................................. | 326/81 |
| 5,675,278 | 10/1997 | Tanaka et al. ............................ | 326/83 |
| 5,684,415 | 11/1997 | McNamus ................................ | 326/27 |

FOREIGN PATENT DOCUMENTS 194134  9/1986  European Pat. Off. .
630110  12/1994  European Pat. Off. .

OTHER PUBLICATIONS

Ohtomo Y. et al; "A Quarter–Micron SIMOX–CMOS LVT-TL–Compatible Gate Array with an Over 2,000 V ESD-–Protection Circuit"; May 5, 1996; pp. 57–60.

"5–Volt Signal Level Shifter in a 3–Volt CMOS Circuit"; IBM Technical Disclosure Bulletin, vol. 32, No. 7, Dec. 1, 1989, pp. 454/455.

*Primary Examiner*—Jon Santamauro
*Assistant Examiner*—Don Phu Le
*Attorney, Agent, or Firm*—David K. Lucente

[57] ABSTRACT

An on-chip driver is described for applications voltage output signals are desired from a digital sub-micron CMOS integrated circuit. The driver includes a signal buffer, signal level shifter, output pull-up, and an output pull-down. The signal buffer is coupled to a digital CMOS input for generating a corresponding buffered signal that is received by both the output-up down and the level shifter. The output pull-down is responsive to the buffered signal and operates to pull the output of the driver to a low voltage level of about 0 volts when the digital CMOS input is at a low logic state. Further, the level shifter is responsive to the buffered signal for generating a voltage shifted signal that is received by the pull-up which pulls the output of the driver to a high voltage level of 2.5 volts or greater when the digital CMOS input is at a high logic state.

29 Claims, 2 Drawing Sheets

OUTPUT DRIVER FOR SUB-MICRON CMOS

FIELD OF THE INVENTION

The present invention relates to complementary MOS (CMOS) integrated circuit technologies, and in particular to sub-micron CMOS having an output driver that provides a digital logic output voltage.

BACKGROUND OF THE INVENTION

There are generally three logic families for use in digital systems: transistor-transistor logic (TTL), complementary metal-oxide semiconductor logic (CMOS), and emitter-coupled logic (ECL). The use of a particular logic family within an electrical design is governed mainly by design considerations such as speed, power consumption, noise immunity, cost, availability, and ease of interfacing with other logic families.

TTL has been the most widely used logic family for many years in applications that use small-scale integration and medium-scale integration. The TTL family is powered by a supply voltage of five volts. Correspondingly, there is a proliferation of systems in the electronics industry which utilize five volt power supplies as either the main power supply or at least one of the primary power supplies.

There are many integrated circuits (ICs) within the CMOS logic family that are compatible (i.e., five volt compliant) with TTL. This allows for the introduction of both TTL and CMOS integrated circuits within an electrical design without the need to provide additional circuitry to interface the different logic families together.

In many cases, the digital output signal of a CMOS integrated circuit is made TTL compatible by using a standard CMOS inverter, scaled appropriately to drive an off-chip TTL load, as a pad driver which is bonded to the pin of the CMOS integrated circuit package. The pin of the CMOS integrated circuit is connected to other integrated circuits by means of a system board such as a printed circuit board (PCB).

It is well known that CMOS integrated circuits with gate oxides thicker than approximately 120 Angstroms can safely and reliably operate with a supply voltage of five volts. However, in the semiconductor industry there has emerged a trend toward the development of low voltage, high-density, sub-micron processing technologies. Thus, as CMOS integrated circuit technologies continue to shrink in physical size, the supply voltage that these processes are capable of supporting is also reduced.

For instance, in a sub 0.5mm CMOS process, the gate oxide is often reduced to 90 Angstroms which is not capable of supporting a five volt power supply in a reliable fashion. Long term exposure of such a small geometry gate oxide to a voltage greater than 3.3 volts can lead to failure of the CMOS integrated circuit. Nevertheless, some systems that include smaller geometry silicon integrated circuits are still operated with a supply voltage of five volts.

To reduce the stress on the smaller geometry integrated circuits, digital libraries have been developed which operate with supply voltages of 3.3 volts or less, rather than at the traditional five volt level. However, it has not been possible to convert all the myriads of electronic devices to operate by using less than five volts. For example, a newer sub-micron CMOS microprocessor may operate at 3.3 volts while the only I/O buffers available to use with the microprocessor are 5-volt ICs from the TTL logic family. Thus, some ICs in the circuit design may require a supply voltage of five volts while others must operate at 3.3 volts.

If both 5 volt integrated circuits and 3.3 volt sub-micron integrated circuits are used in an electrical design, then additional measures must be taken to interface the circuits together. These extra steps are needed since smaller geometry integrated circuits are precluded from driving out a true five volt logic signal because of their reduced voltage restriction. Thus, voltage level translators or shifters are required between those sub-micron integrated circuits operating at 3.3 volts and those integrated circuits operating at five volts.

A typical solution to the above-stated voltage level shifting problem is to use special level shifter ICs between the circuits having five volt logic inputs and the 3.3 volt sub-micron CMOS outputs. The level shifter ICs are capable of responding to a low voltage swing (3.3 volts) digital input and driving out a full five volt output signal. However, such level shifters are fabricated using a larger geometry CMOS process (i.e., larger than sub-micron) or some other silicon process capable of supporting both five volt supply voltages and five volt gate oxide voltages.

Another alternative to the level shifting problem is to drive a five volt powered CMOS integrated circuit directly with the output of a 3.3 volt sub-micron integrated circuit and adjust the threshold levels of the five volt powered CMOS device to accept the reduced output voltage swing of the 3.3 volt device. However, in some cases, reducing the input threshold levels of existing integrated circuits can be costly.

The present invention overcomes the above-discussed problems by providing a sub-micron CMOS output driver that can generate a five volt digital output without over-stressing the gate oxides of the driver.

SUMMARY OF THE INVENTION

The present invention provides a digital output driver fabricated by a sub-micron CMOS process.

The on-chip structure embodying the present invention is especially suitable for applications wherein five volt logic output signals are desired from a sub-micron CMOS integrated circuit. The present invention allows for small geometry integrated circuits to directly interface with five volt devices. As such, the present invention eliminates the need for either adding voltage level shifters to the system board or requiring that the input threshold levels of existing five volt components be redesigned.

The output driver embodying the present invention is fabricated by a sub-micron CMOS process and includes a signal buffer, signal level shifter, output pull-up, and an output pull-down. The signal buffer is coupled to a digital CMOS input for generating a corresponding buffered signal that is received by both the output pull-down and the level shifter. The output pull-down is responsive to the buffered signal and operates to pull the output of the driver to a low voltage level when the digital CMOS input is at a low logic state. Further, the level shifter is responsive to the buffered signal for generating a voltage shifted signal that is received by the pull-up that pulls the output of the driver to a high voltage level when the digital CMOS input is at a high logic state.

BRIEF DESCRIPTION OF THE DRAWINGS

In the accompanying drawings that form part of the specification, and in which like numerals are employed to designate like elements throughout the same.

DESCRIPTION OF THE PREFERRED EMBODIMENTS

The present invention provides a digital output driver for sub-micron CMOS. The device embodying the present invention includes a signal buffer, signal level shifter, output pull-up, and an output pull-down fabricated by a sub-micron CMOS process. The signal buffer is operatively connected to a digital CMOS input for generating a corresponding buffered signal that is received by both the output pull-down and the level shifter. The output pull-down is responsive to the buffered signal and operates to pull the output of the driver to a low voltage level when the digital CMOS input is at a low logic state. Further, the level shifter is responsive to the buffered signal for generating a voltage shifted signal that is received by the pull-up which operates to pull the output of the driver to a high voltage level when the digital CMOS input is at a high logic state. The driver is preferably used in a deep sub-micron process.

Figure 1:
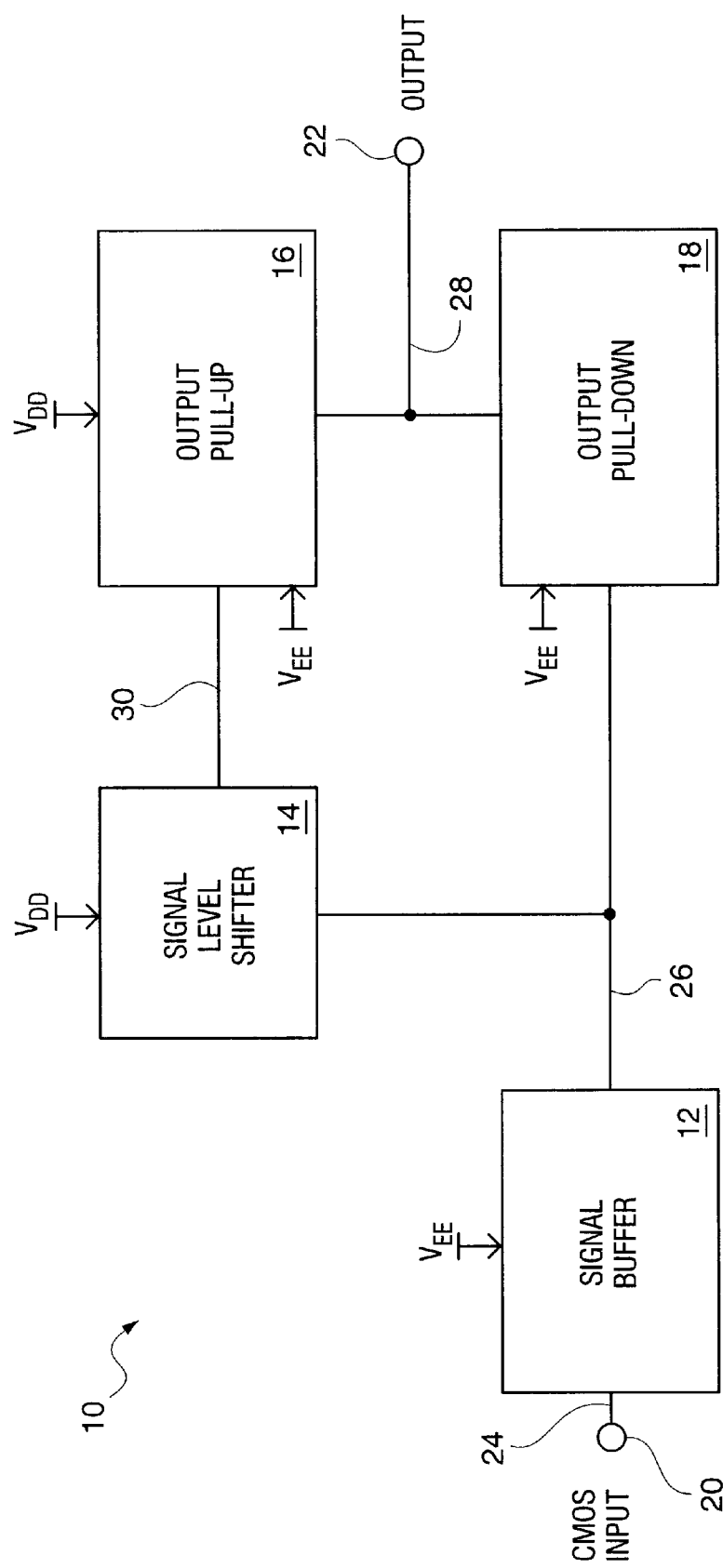
FIG. 1 is a block diagram illustrating an output driver for sub-micron CMOS in accordance with the present invention.

Referring to the drawings, and particularly to FIG. 1, an output driver that is fabricated by a conventional sub-micron CMOS process is depicted. The output driver 10 includes a signal buffer 12, a level shifter 14, an output pull-up 16, and an output pull-down 18. Within FIG. 1, a single block may indicate several individual components and/or circuits which collectively perform a single function. Likewise, a single line may represent several individual signal or energy transmission paths for performing a particular operation.

As illustrated by FIG. 1, a low supply voltage, $V_{EE}$, is connected to the signal buffer 12, the output pull-up 16, and the output pull-down 18. Preferably, the supply voltage $V_{EE}$ has a voltage potential that is similar to the voltage at CMOS INPUT 20 during a high logic state.

For ease of description, a voltage potential of 3.3 volts is referred to herein as representing a high logic state at the CMOS INPUT 20. However, it should be understood that the present invention is not to be limited to just this voltage potential for a high logic state at CMOS INPUT 20. Instead, the present invention is applicable to a variety of voltages other than 3.3 such as 3.0 volts or 2.4 volts.

Another voltage source, $V_{DD}$, is coupled to the signal level shifter 14 and the output pull-up 16. $V_{DD}$ is selected to provide a higher voltage potential than $V_{EE}$. Preferably, the high voltage supply $V_{DD}$ has a voltage potential that is similar to the voltage required at OUTPUT 22 for representing a high logic state.

As shown in FIG. 1, the output driver signal buffer 12 is adapted to receive digital CMOS INPUT signals from input node 20 via lead or path 24. Preferably, the CMOS INPUT provided at input node 20 conforms to conventional CMOS logic level requirements at about 3.3 volts operation. The input node 20 may be coupled to a typical output driver from a digital 3.3 volt CMOS logic gate or any other device capable of producing a conventional CMOS logic level input signal which is generally equal to the voltage potential provided by $V_{EE}$.

The buffered output lead 26 of the signal buffer 12 is connected to level shifter 14 and output pull-down 18. The signal buffer 12 provides isolation between input node 20 and both the level shifter 14 and the output-pull down 18. Further, the signal buffer 12 provides a digital logic signal on output path 26 in response to the logic state of the input node 20.

The digital logic signal on lead 26 is received by output pull-down 18 which provides a low logic output on lead 28 in response to the signal from the signal buffer 12. In particular, the pull-down circuit 18 pulls the output node 22 to a low logic level, such as ground, whenever the buffered output 26 from the signal buffer 12 is driven to a voltage level which represents a low logic state at the digital CMOS INPUT 20.

As stated above, the digital logic signal on lead 26 is also received by the signal level shifter 14 which provides a voltage shifted output or signal on lead 30 in response to the output signal from the signal buffer 12. The level shifter 14 shifts the voltage level of the output signal from the buffered output lead 26 to a voltage level that is suitable for driving the output pull-up 16, via lead 30. Preferably, the signal level shifter 14 provides an enable signal, preferably less than 5 V, to output pull-up 16 via lead 30 when the buffered output 26 from the signal buffer 12 is driven to a voltage level that represents a high logic state at CMOS INPUT 20.

As such, the output pull-up 16 is responsive to the enable signal from the signal level shifter, via lead 30, to provide a high logic output on lead 28. Preferably, the output pull-up 16 pulls the output node 22 to a high logic level, such as 2.5 volts or greater, with a capability of driving a full 5V. This pull-up function occurs whenever the enable signal provided by the signal level shifter 14, via lead 30, and thus input node 20, represents a high logic state.

As appreciated by those skilled in the art, in a small geometry process where the gate oxide thickness cannot be subject to voltage potential such as five volts, the output pull-up 16 and the output pull-down 18 must be configured so that no gate oxide is stressed. As explained in detail further herein, the output driver 10 is configured to prevent the gate oxides from being overstressed.

Figure 2:
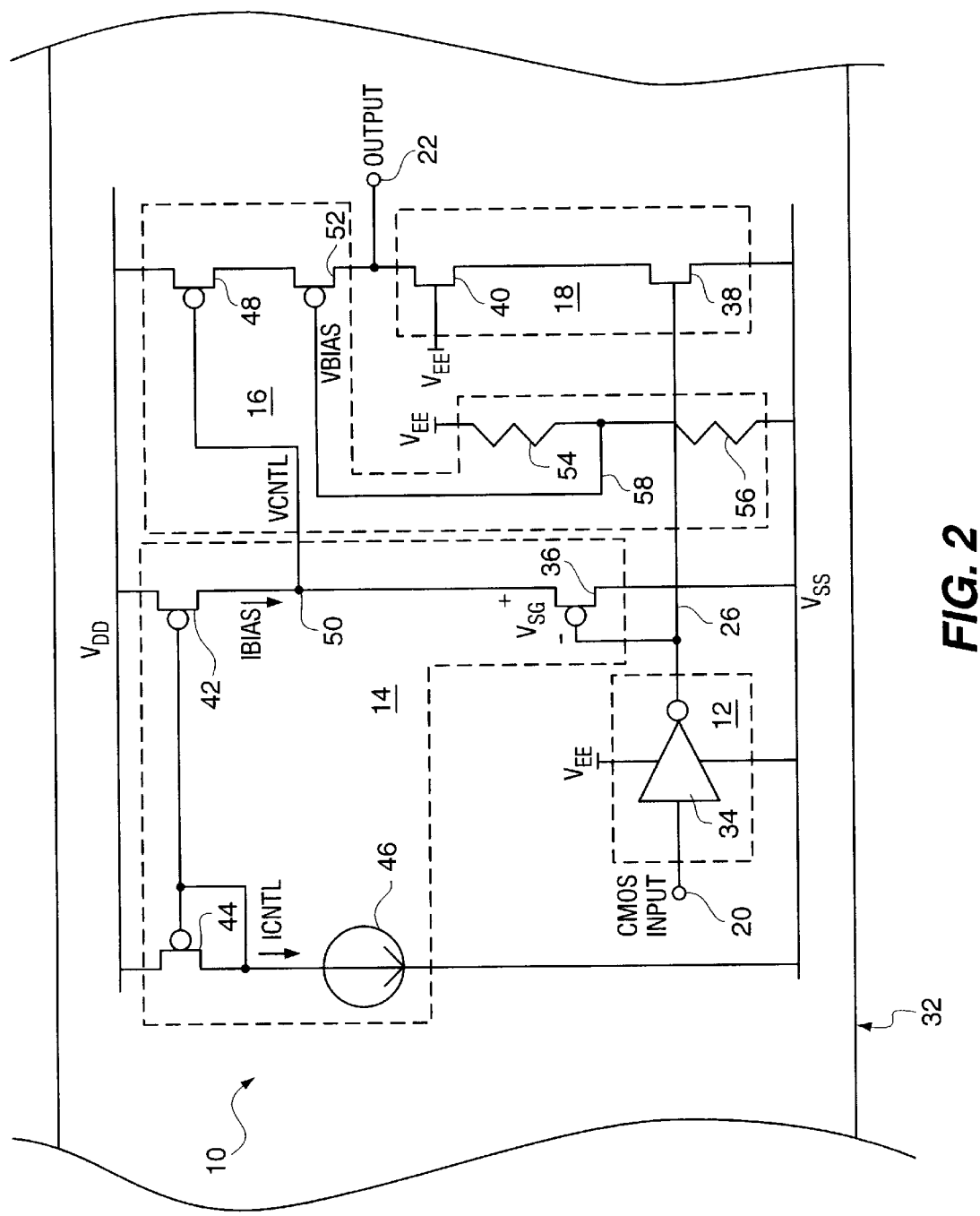
FIG. 2 is a simplified circuit schematic of the output driver for sub-micron CMOS depicted in FIG. 1 which is five volt compliant.

Referring to FIG. 2, a simplified schematic of a sub-micron CMOS integrated circuit 32 is depicted which includes the signal buffer 12, signal level shifter 14, output pull-up 16, and output pull-down 18. The embodiment of FIG. 2 shows the invention utilizing a standard n-well CMOS process.

Preferably, $V_{EE}$ provides a voltage potential of about 3.3 volts and VDD provides a voltage potential of approximately five volts. These voltage potentials are preferred because the output driver of FIG. 2 is designed to boost a 3.3 volt logic CMOS INPUT signal at node 20 to render an OUTPUT signal at node 22 which is compatible with a device that operates at or near five volts such as the input of a TTL or CMOS gate. As such, the voltage spread provided at OUTPUT 22 is the difference between a CMOS five volt high signal and a TTL or CMOS zero volt low signal, which is equal to five volts. It should be noted that TTL has a threshold input voltage of about 0.8 V to about 2.0 V and CMOS has a threshold voltage of about ½ $V_{SUPPLY}$.

Although the embodiment depicted in FIG. 2 consists of an output driver 10 for a CMOS sub-micron component that is supplied with both 3.3 volts and 5.0 volts for $V_{EE}$ and $V_{DD}$, respectively, it should be understood d with a differential voltage greater than about 3.3 v that the present invention is not to be limited to just these voltages. That is, the invention is applicable to a variety of voltage combinations wherein $V_{DD}$ is approximately 5 volts and $V_{EE}$ is less than $V_{DD}$. For instance, $V_{DD}$ may be at 5 volts while $V_{EE}$ is specified to provide 3 volts.

As shown in FIG. 2, the signal buffer 12 preferably includes an inverter 34, or an equivalent thereof, for providing isolation between the input node 20 and both the level shifter 14 and the output pull-down 18. The inverter 34 is powered by low voltage source $V_{EE}$. The input of the signal buffer 12 is coupled to the input node 20 for receiving a digital signal which conforms to conventional CMOS logic level requirements at 3.3 volts operation (i.e. the same as the supply voltage $V_{EE}$).

The output 26 of the signal buffer inverter 34 is connected to the gates of both a p-channel transistor 36 and an n-channel transistor 38. The output 26 of the inverter 34 provides a digital 3.3 volt CMOS logic signal that corresponds to the inverted logic state of the input node 20. The output 26 of the inverter 34 turns transistor 38 off and on and varies the voltage at the gate of transistor 36.

The output pull-down 18 includes the n-channel transistor 38 and n-channel transistor 40 which are connected in series to each other between the output node 22 and $V_{SS}$ (i.e., ground) to form a cascode current sink configuration. As stated above, the gate of n-channel device 38 is coupled to the output 26 of the signal buffer inverter 34. Further, the gate of n-channel device 40 is connected to low voltage source $V_{EE}$.

The output 26 of the inverter 34 controls transistor 38 such that when the inverter output is driven to a high logic level, transistor 38 pulls the output node 22 to ground (i.e., $V_{SS}$) via transistor 40.

The signal level shifter 14 includes the p-channel transistor 36, p-channel transistors 42 and 44, and a constant current sink 46. The p-channel devices 42 and 44 and current sink 46 are coupled together to create a current mirror. As such, the sources of p-channel transistors 42 and 44 are connected to supply voltage $V_{DD}$ and the gates of the transistors are connected to each other. Further, the gate and the drain of transistor 44 are connected to each other.

The current mirror is programmed by the current sink 46 which is connected between the drain of transistor 44 and $V_{SS}$. The current sink 46 is conventional in construction and sinks a control current, ICNTL, from the drain of transistor 44 such that an essentially matching bias current, IBIAS, is emitted from the drain of transistor 42. Those skilled in the art will appreciate that mirroring is not required in embodiments wherein a constant current source is directly available to provide IBIAS.

The transistors 42 and 36 of the level shifter 14 are coupled in series between $V_{SS}$ and supply voltage $V_{DD}$. The gate of a p-channel device 48 is coupled to node 50 between transistors 42 and 36. As explained in detail further herein, the voltage at node 50 is controlled, in part, by transistor 36 such that sufficient drive is provided to enable the output pull-up 16 when the digital signal provided by the inverter 34 is at a low voltage level, and thus the input node 20 is at a high voltage level.

The output pull-up 16 includes the p-channel transistor 48, a p-channel transistor 52, and a voltage divider employing resistors 54 and 56. The p-channel transistors 48 and 52 are connected in series to each other between the supply voltage $V_{DD}$ and the output node 22 to form a cascode current source configuration. As stated above, the gate of p-channel device 48 is coupled to node 50. Further, the gate of p-channel device 52 is connected to the voltage divider, via lead 58, which provides a fixed bias voltage output, VBIAS.

Preferably, the voltage divider provides approximately 2 volts to the gate of transistor 52 by dividing the 3.3 supply voltage from $V_{EE}$. The voltage divider includes resistors 54 and 56 which are connected in series to each other between supply voltage $V_{EE}$ and $V_{SS}$. The fixed bias voltage output VBIAS is provided where resistor 54 and 56 are joined together. The values of the resistors 54,56 are chosen with regard to the highest p-channel threshold voltage that can occur and the lowest supply voltage $V_{DD}$. Thus, the p-channel device 52 is in its saturated region when pull-up transistor 48 is initially turned on.

In operation, the output 22 of the driver 10 provides two separate logic states which correspond to when the CMOS INPUT 20 is driven to a low and high voltage level relative to the low voltage $V_{EE}$. A low logic state at CMOS INPUT 20 is represented by a voltage of approximately 0 volts and a high logic state is represented by a voltage level that is approximately equal to the voltage provided by $V_{EE}$ (i.e., 3.3 volts).

When input node 20 is driven low (i.e., 0 volts), the output 26 of the inverter 34 is driven to a high voltage level of approximately 3.3 volts. Correspondingly, the gate of level shifter transistor 36 is driven to a high voltage level of approximately 3.3 volts.

As indicated above, bias current IBIAS from the current mirror is emitted from the drain of transistor 42 to the source of device 36. The bias current IBIAS forces a fixed voltage drop $V_{SG}$ from the source (i.e., node 50) to the gate (i.e. node 26) of device 36. Preferably, the bias current IBIAS from device 42 is configured to provide a voltage drop $V_{SG}$ in the range of approximately two volts.

Although only transistor 36 is depicted in FIG. 2 as providing the voltage drop $V_{SG}$ in response to the bias current IBIAS, it should be recognized that the transistor can be coupled together with another voltage shifting transistor to provide a fixed voltage drop substantially greater than two volts for turning the output pull-up 16 off and on.

Since $V_{SG}$ is generally equal to two volts and the voltage at output 26 is approximately 3.3 volts, the voltage at node 50 is forced to about five volts because the voltage at node 50 is equal to $V_{SG}$ plus the voltage at inverter output 26. Correspondingly, pull-up transistor 48 is turned off because of the high voltage (i.e., 5 volts) at the gate 50 of the pull-up transistor. Therefore, no current flows through device 48, and thus transistor 52, since device 48 is turned off when the input node 20 is driven low.

Conversely, as the input node 20 is still being driven low, the 3.3 volts at the output 26 of the inverter 34 turns pull-down transistor 38 on. Further, transistor 40 is turned on since its gate is connected to low voltage power supply $V_{EE}$. With both transistor 38 and 40 turned on, the output node 22 is pulled approximately to the same voltage level as $V_{SS}$ (i.e., ground), depending on the resistive load connected to node 22. Thus, driving the input node 20 of the drive 10 to a low voltage level results in the output node 22 being pulled to ground by circuit 18.

As appreciated by those skilled in the art, transistor 40 protects transistor 38 from having an unreliable situation wherein the entire voltage between the output node 22 and $V_{SS}$ is across only the gate of transistor 38. As such, transistors 40 and 38 are connected together in a cascode configuration. However, it is apparent that other configurations may be substituted for the cascode configuration in order to ensure reliable operation of pull-down transistor 38.

Turning to the second state, wherein the input node 20 is driven high (i.e., approximately 3.3 volts), the output 26 of the inverter 34 provides a voltage level of approximately 0 volts at the gates of transistors 36 and 38. Thus, pull-down transistor 38 is turned off which results in no current flowing through device 38, and thus transistor 40.

Conversely, pull-up transistor 48 is turned on as the input node 20 is being driven high. The transistor 48 is activated due to an enabling voltage level of approximately 2 volts at node 50. The voltage at node 50 is provided by the bias current IBIAS from the drain of transistor 42 causing the fixed voltage drop $V_{SG}$ from the source (i.e., node 50) to the gate (i.e. node 26) of device 36. As indicated above, the voltage drop $V_{SG}$ preferably is in the range of approximately 2 volts.

Because the voltage at node 50 is equal to $V_{SG}$ (i.e., two volts) plus the voltage at inverter output 26 (i.e., 0 volts), the voltage at node 50 is two volts. Accordingly, pull-up transistor 48 is turned on because of the low voltage at the gate 50 of the p-channel transistor.

Furthermore, transistor 52 is turned on since its gate is connected to the voltage divider, via lead 58, which provides a fixed bias voltage output VBIAS of approximately 2 volts. With both transistor 48 and 52 of the pull-up circuit 16 turned on, the output node 22 is pulled to approximately the same voltage level as supply voltage $V_{DD}$. Thus, forcing the input node 20 of the driver 10 to a high voltage level results in the output node 22 being pulled to the voltage level of supply voltage $V_{DD}$ by circuit 16.

As apparent to those skilled in the art, transistor 48 is protected from an unreliable situation wherein the voltage drop between the supply voltage $V_{DD}$ and the output node 22 is not entirely placed across the transistor. Instead, transistors 48 and 52 are connected together in a cascode configuration with transistor 52 being saturated by the voltage provides by the voltage divider. However, other configurations may be substituted for the cascode configuration in order to protect pull-up transistor 48. Further, the voltage divider may not be required in embodiments wherein a suitable constant voltage source is directly available.

As evident from the circuit depicted in FIG. 2 and the above description, no transistor within the driver 10 has a voltage potential greater than approximately 3.3 volts across its gate oxide. This feature of the driver 10 is maintained during operation either in a static mode, when the input 20 is forced either high or low, or during a dynamic mode, when the input is switching between a high and low voltage.

It will be readily apparent from the foregoing detailed description of the invention and from the illustrations thereof that numerous variations and modifications may be effected without departing from the true spirit and scope of the novel concepts or principles of this invention.

What is claimed is:

1. An output driver within a sub-micron CMOS integrated circuit coupled to a low voltage source and a high voltage source for providing an output responsive to a CMOS input, said high voltage source having a greater voltage potential than said low voltage source and said output driver comprising:

(a) a signal buffer coupled to said low voltage source and said CMOS input for generating a buffered signal;

(b) a biased device, having a fixed voltage drop, that is coupled to the signal buffer and that generates a voltage shifted signal;

(c) an output pull-up coupled to said high voltage source and responsive to said voltage shifted signal for pulling said output to a high voltage level; and (d) an output pull-down responsive to said buffered signal for pulling said output to a low voltage level.

2. The output driver of claim 1, wherein said high voltage level is TTL and CMOS compatible.

3. The output driver of claim 1, wherein said CMOS input is less than five volts.

4. The output driver of claim 3, wherein said CMOS input is in a range of about 3.3 volts to about 0 volts.

5. The output driver of claim 1, wherein said signal buffer is an inverter.

6. The output driver of claim 1 further comprising a current source operatively connected to the biased device for generating said voltage shifted signal.

7. The output driver of claim 6, wherein said biased device is operatively connected to said signal buffer and said output pull-up.

8. The output driver of claim 7, wherein said current source provides the voltage drop across said biased device.

9. The output driver of claim 8, wherein said biased device is a p-channel transistor.

10. The output driver of claim 1, wherein said output pull-up includes at least two transistors connected in series between said high voltage source and said output.

11. The output driver of claim 10, wherein said two transistors are p-channel transistors.

12. The output driver of claim 10, wherein one of said two transistors is connected to a voltage divider which provides a fixed bias voltage output.

13. The output driver of claim 1, wherein said output pull-down includes at least two transistors with one of said two transistors connected to said output.

14. The output driver of claim 13, wherein said two transistors are n-channel transistors.

15. An output driver within a sub-micron CMOS integrated circuit having an output and operatively connected to a low voltage source and a high voltage source, said output driver comprising:

(a) a signal buffer coupled to said low voltage source and a digital CMOS input signal in a range of about 3.3 volts to 0 volts for generating a buffered signal;

(b) a level shifter within said sub-micron CMOS integrated circuit and coupled to said high voltage source, said level shifter responsive to said buffered signal for generating a voltage shifted signal and said level shifter includes a current source and a biased device wherein the current source biases the biased device to provide the voltage shifted signal;

(c) an output pull-up coupled to said high voltage source and responsive to said voltage shifted signal for pulling said output to a TTL compatible high logic state; and (d) an output pull-down responsive to said buffered signal for pulling said output to a TTL compatible low logic state.

16. The output driver of claim 15, wherein said level shifter includes a current source operatively connected to a transistor for generating said voltage shifted signal.

17. The output driver of claim 16, wherein said current source provides a voltage drop across said transistor of approximately two volts and said transistor is operatively connected to both said buffered signal and said output pull-up.

18. The output driver of claim 16, wherein said transistor has a gate oxide of about 90 Angstroms or less.

19. The output driver of claim 15, wherein said output pull-up includes two transistors connected in series between said high voltage source and said output.

20. The output driver of claim 15, wherein said output pull-down includes at least two transistors with one of said two transistors connected to said output.

21. An output driver for providing an output responsive to a CMOS input comprising:

(a) a level shifter including a current source and a submicron CMOS transistor having a maximum gate oxide voltage and responsive to said CMOS input for generating a voltage shifted signal, the current source provides a fixed voltage drop across said transistor to generate the voltage shifted signal;

(b) an output pull-up responsive to said voltage shifted signal for pulling said output to a high logic state; and (c) an output pull-down responsive to said CMOS input for pulling said output to a low logic state.

22. The output driver of claim 21, wherein said output is TTL compatible.

23. The output driver of claim 21, wherein said CMOS input is in a range of about 3.3 volts to 0 volts.

24. The output driver of claim 21, wherein said level shifter further includes a current source operatively connected to said transistor.

25. The output driver of claim 21, wherein said transistor is a p-channel transistor.

26. The output driver of claim 21, wherein said transistor has a gate oxide of about 90 Angstroms or less.

27. The output driver of claim 21, wherein said output pull-up includes at least two transistors connected in series with one of said two transistors connected to said output.

28. The output driver of claim 21, wherein said output pull-down includes at least two transistors connected in series with one of said two transistors connected to said output.

29. An output driver, coupled to a low voltage source and a high voltage source, including a bias constant current device and a voltage drop device that are coupled to the high voltage supply and that generate a voltage shifted signal responsive to an input signal, wherein the bias current device biases a voltage drop across the voltage drop device.

* * * * *